United States Patent
Lee et al.

(10) Patent No.: US 10,970,164 B2
(45) Date of Patent: Apr. 6, 2021

(54) STORAGE DEVICE AND OPERATING METHOD OF STORAGE DEVICE

(71) Applicant: SAMSUNG ELECTRONICS CO., LTD., Suwon-si (KR)

(72) Inventors: Chulseung Lee, Seoul (KR); Soon Suk Hwang, Ansan-si (KR); Choongeui Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 180 days.

(21) Appl. No.: 16/248,540

(22) Filed: Jan. 15, 2019

(65) Prior Publication Data

US 2019/0354431 A1   Nov. 21, 2019

(30) Foreign Application Priority Data

May 21, 2018 (KR) .................. 10-2018-0057726

(51) Int. Cl.
| | | |
|---|---|---|
| *G11C 29/00* | (2006.01) | |
| *G06F 11/10* | (2006.01) | |
| *G11C 29/52* | (2006.01) | |
| *G06F 3/06* | (2006.01) | |
| *G11C 7/10* | (2006.01) | |
| *G11C 7/22* | (2006.01) | |

(52) U.S. Cl.
CPC ........ *G06F 11/1068* (2013.01); *G06F 3/0619* (2013.01); *G06F 3/0659* (2013.01); *G06F 3/0679* (2013.01); *G11C 7/1084* (2013.01); *G11C 7/22* (2013.01); *G11C 29/52* (2013.01); *G11C 2207/2254* (2013.01)

(58) Field of Classification Search
CPC .. G06F 11/1068; G06F 3/0619; G06F 3/0659; G06F 3/0679; G11C 7/1084; G11C 7/22; G11C 29/52; G11C 2207/2254
USPC ....... 714/764, 776, 704, 708, 718, 719, 746, 714/763, 42, 43, 44, 31; 370/232, 473, 370/469
See application file for complete search history.

(56) References Cited

U.S. PATENT DOCUMENTS

| | | | |
|---|---|---|---|
| 6,812,827 B2 * | 11/2004 | Laskowsky | ........... H04L 1/0001 340/511 |
| 7,313,737 B2 * | 12/2007 | Gronberg | ............... H04L 1/0009 714/704 |
| 9,417,945 B2 | 8/2016 | Authement et al. | |
| 9,558,850 B1 | 1/2017 | Bialas, Jr. et al. | |
| 2004/0123207 A1 | 6/2004 | Zunkehr et al. | |
| 2006/0277434 A1 * | 12/2006 | Tsern | .................. G06F 11/0793 714/17 |
| 2011/0218949 A1 | 9/2011 | Cho et al. | |
| 2014/0241082 A1 | 8/2014 | Tam | |
| 2015/0066819 A1 | 3/2015 | Mozak et al. | |

(Continued)

*Primary Examiner* — Christine T. Tu

(74) *Attorney, Agent, or Firm* — Volentine, Whitt & Francos, PLLC

(57) ABSTRACT

A storage device includes a nonvolatile memory device, and a controller that reads first data from the nonvolatile memory device. When a number of first errors of the first data is not smaller than a first threshold value, the controller determines whether the first errors include timing errors arising from a variation of signal transmission timings between the nonvolatile memory device and the controller and performs a retraining operation on the signal transmission timings when the first errors include the timing errors.

20 Claims, 13 Drawing Sheets

(56) References Cited

U.S. PATENT DOCUMENTS

2016/0180898 A1 6/2016 Hwang et al.
2017/0269991 A1* 9/2017 Bazarsky ............ G06F 11/1012

* cited by examiner

STORAGE DEVICE AND OPERATING METHOD OF STORAGE DEVICE

CROSS-REFERENCE TO RELATED APPLICATIONS

This U.S. non-provisional patent application claims priority under 35 U.S.C. § 119 to Korean Patent Application No. 10-2018-0057726, filed on May 21, 2018 in the Korean Intellectual Property Office, the disclosure of which is incorporated by reference herein in its entireties.

BACKGROUND

1. Technical Field

The present disclosure relates to a semiconductor memory. More particularly, the present disclosure relates to a storage device and an operating method of the storage device.

2. Description of Related Art

A storage device refers to a device which stores data under control of a host device such as a computer, a smartphone, or a tablet. A storage device stores data, and may be a magnetic disk such as a hard disk drive (HDD), or a nonvolatile memory (a form of semiconductor memory) such as a solid-state drive (SSD) or a memory card.

A nonvolatile memory device may be or include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), or a ferroelectric RAM (FRAM), etc.

Operating speeds of the storage devices have improved as technology for manufacturing a semiconductor circuit develops. In particular, a data communication speed between a nonvolatile memory device and a controller to control the nonvolatile memory device has sharply increased. The sharp increase of the data communication speed causes unexpected errors, thereby reducing the reliability of the storage device.

SUMMARY

Embodiments of the present disclosure provide a storage device with improved reliability and an operating method of the storage device.

According to an exemplary embodiment, a storage device includes a nonvolatile memory device and a controller that reads first data from the nonvolatile memory device. When a number of first errors of the first data is not smaller than a first threshold value, the controller determines whether the first errors include timing errors arising from a variation of signal transmission timings between the nonvolatile memory device and the controller and performs a retraining operation on the signal transmission timings when the first errors include the timing errors.

According to another exemplary embodiment, a storage device includes first nonvolatile memory devices, second nonvolatile memory devices, and a controller that communicates with the first nonvolatile memory devices through a first channel and communicates with the second nonvolatile memory devices through a second channel. When a number of errors of data read from a specific nonvolatile memory device of the first nonvolatile memory devices is not smaller than a threshold value, the controller determines whether the errors include timing errors arising from a variation of signal transmission timings between the specific nonvolatile memory device and the controller and determines the first nonvolatile memory devices as targets of a retraining operation when the errors include the timing errors.

According to yet another exemplary embodiment, a storage device includes a nonvolatile memory device and a controller. An operating method of the storage device includes the controller reading data from the nonvolatile memory device, transmitting first test data to the nonvolatile memory device, receiving second test data when a number of first errors of the first test data is not smaller than a first threshold value, and performing a retraining operation on the nonvolatile memory device when a number of second errors of the second test data is not smaller than a second threshold value.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure may be described in detail and clearly to such an extent that an ordinary one in the art easily implements the inventive concept(s) described herein.

Figure 1:
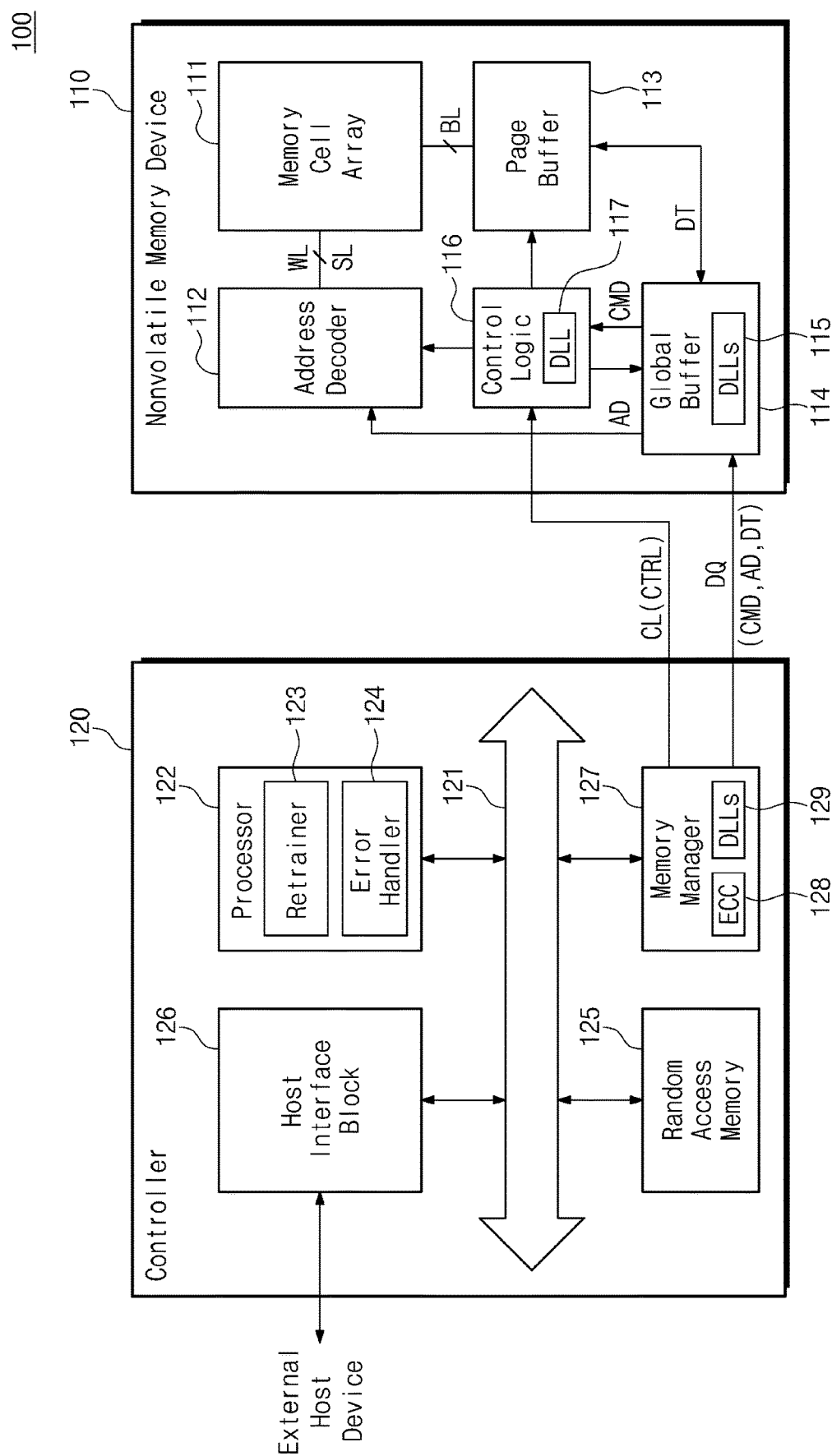
FIG. 1 is a block diagram illustrating a storage device according to an embodiment of the present disclosure.

FIG. 1 is a block diagram illustrating a storage device 100 according to an embodiment of the present disclosure.

In FIGs. herein including FIG. 1, circuitry may be shown as, for example, a "host interface block", a "controller", a "processor", a "retrainer", an "error handler", a "memory manager", and "control logic". As is traditional in the field of the inventive concept(s) described herein, examples may be described and illustrated in terms of blocks which carry out a described function or functions. These blocks, which may be referred to herein as a host interface block, a controller, a processor, a retrainer, an error handler, a memory manager, and control logic, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

Referring to FIG. 1, the storage device 100 includes a nonvolatile memory device 110 and a controller 120. The nonvolatile memory device 110 is configured to perform a write operation, a read operation, or an erase operation under control of the controller 120. The nonvolatile memory device 110 may include a memory cell array 111, an address decoder 112, a page buffer 113, a global buffer 114, and control logic 116. Consistent with the explanation of functional blocks above, references to logic such as control logic 116 herein refer to a circuit of one or more circuit elements such as a programmable logic device (PLD), a complex programmable logic device (CPLD), and/or a processor including an application-specific integrated circuit (ASIC).

The memory cell array 111 may include multiple memory blocks. Each memory block includes multiple memory cells. Each memory block may be connected to the address decoder 112 at least through word lines WL and selection lines SL. Each memory block may be connected to the page buffer 113 through multiple bit lines BL.

In an embodiment, each of the memory blocks may be or correspond to a unit of the erase operation. The memory cells of the memory cell array 111 may be erased for each memory block. The memory cells belonging to one memory block may be erased at the same time. In another example embodiment, each memory block may be divided into multiple sub-blocks. Each of the sub-blocks may be or correspond to a unit of the erase operation.

The address decoder 112 is connected to the memory cell array 111 through the word lines WL and the selection lines SL. The address decoder 112 operates under control of the control logic 116. The address decoder 112 may receive an address AD from the global buffer 114, may decode the address AD, and may control voltages to be applied to the selection lines SL and the word lines WL depending on the decoded address.

The page buffer 113 is connected to the memory cell array 111 through the bit lines BL. The page buffer 113 may exchange data DT with the global buffer 114. In the write operation, the page buffer 113 may receive the data DT from the global buffer 114 and may control voltages of the bit lines BL depending on the received data.

In the read operation, the page buffer 113 may latch voltages of the bit lines BL and may transmit a result of the latch operation to the global buffer 114 as the data DT. In a training or retraining operation, the page buffer 113 may receive the data DT from the global buffer 114 and may return the received data DT to the global buffer 114.

The global buffer 114 may receive a command CMD, the address AD, or the data DT through input/output lines DQ from the controller 120. Under control of the control logic 116, the global buffer 114 may transmit the command CMD to the control logic 116, may transmit the address AD to the address decoder 112, and may transmit the data DT to the page buffer 113.

The global buffer 114 may transmit the data DT to the controller 120 through the input/output lines DQ. The global buffer 114 may include delay locked loops 115 for data transmission. The delay locked loops 115 may correspond to the input/output lines DQ, respectively.

Delays of the delay locked loops 115 may be adjusted by the training or retraining operation. The global buffer 114 may respectively transmit pieces of data DT to the controller 120 through the input/output lines DQ depending on outputs of the delay locked loops 115.

The control logic 116 may receive control signals CTRL through control lines CL from the controller 120. Depending on the received control signals CTRL, the control logic 116 (and the controller 120 as the source of the control signals CTRL) may control the address decoder 112, the page buffer 113, and the global buffer 114.

The control logic 116 may transmit the control signals CTRL to the controller 120 through the control lines CL. The control logic 116 may include a delay locked loop 117 for signal transmission. Delays of the delay locked loop 117 may be adjusted by the training or retraining operation. The control logic 116 may transmit the control signals CTRL to the controller 120 through the control lines CL, depending on an output of the delay locked loop 117.

The controller 120 may allow the nonvolatile memory device 110 to perform the write operation, the read operation, or the erase operation. The controller 120 may include a bus 121, a processor 122, a random access memory 125, a host interface block 126, and a memory manager 127.

The bus 121 provides a channel between components of the controller 120. The processor 122 may convert formats of commands transmitted from an external host device and may transmit the commands of the converted formats to the memory manager 127. The processor 122 may perform various functions for maintaining or improving the performance of the storage device 100.

The processor 122 may include a retrainer 123 and an error handler 124. The retrainer 123 may transmit commands to the memory manager 127 such that a retraining operation is performed when a specific condition is satisfied based on the specific condition being satisfied. The retrainer 123 may be implemented in the form of circuits of the processor 122 and/or in the form of codes executable by the circuits.

The error handler 124 may transmit commands to the memory manager 127 such that subsequent processing according to an error is performed when a specific condition is satisfied based on the specific condition being satisfied.

The error handler 124 may be implemented in the form of circuits of the processor 122 and/or in the form of codes executable by the circuits.

The random access memory 125 may be used as a working memory of the processor 122. The random access memory 125 may also be used as a buffer memory or a cache memory between the external host device and the nonvolatile memory device 110. The random access memory 125 may be implemented inside or outside the controller 120 or may be implemented (physically and operatively/functionally) inside and outside the controller 120. The random access memory 125 may be implemented with a DRAM or an SRAM.

The host interface block 126 may communicate with the external host device. The host interface block 126 may transmit, for example, commands provided from the external host device to the processor 122 and may transmit data provided from the external host device to the random access memory 125.

The host interface block 126 may transmit responses to the external host device. The host interface block 126 may transmit data stored in the random access memory 125 to the external host device.

The memory manager 127 may operate in response to commands from the processor 122. The memory manager 127 may exchange the control signals CTRL with the nonvolatile memory device 110 through the control lines CL. The memory manager 127 may transmit the command CMD and the address AD to the nonvolatile memory device 110 through the input/output lines DQ.

The memory manager 127 may transmit the data stored in the random access memory to the nonvolatile memory device 110 as the data DT through the input/output lines DQ. The memory manager 127 may also receive the data DT from the nonvolatile memory device 110 to store the data DT into the random access memory 125.

The memory manager 127 may include an error correction block 128. The error correction block 128 may perform an error correction encoding or decoding based on an error correction code (ECC). The error correction block 128 may add parity to the data DT to be transmitted to the nonvolatile memory device 110. The error correction block 128 may detect and correct errors from the data DT received from the nonvolatile memory device 110 by using the parity.

The memory manager 127 may include delay locked loops 129 for signal transmission and data transmission. Delays of the delay locked loops 129 may be adjusted by the training or retraining operation. Depending on outputs of the delay locked loops 129, the memory manager 127 may transmit the control signals CTRL to the nonvolatile memory device 110 through the control lines CL and may transmit the command CMD, the address AD, and the data DT to the nonvolatile memory device 110 through the input/output lines DQ.

According to an embodiment of the present disclosure, the controller 120 and the nonvolatile memory device 110 are configured to transmit signals (e.g., a control signal and data) by using the delay locked loops 115, the delay locked loop 117, and the delay locked loops 129. When errors of signal transmission timings occur, the controller 120 may perform the retraining operation to calibrate delays of the delay locked loops 115, the delay locked loop 117, and the delay locked loops 129, based on the errors of signal transmission timings occurring. Accordingly, the reliability of the storage device 100 is improved. That is, as the term is used herein in relation to the embodiment of FIG. 1 and other embodiments, "signal transmission timings" or relate to timing of signals (e.g., a control signal and data) transmitted by the controller 120 and the nonvolatile memory device 110 by using the delay locked loops 115, the delay locked loop 117 and the delay locked loops 129.

In the embodiment shown in FIG. 1, the retrainer 123 is implemented in the processor 122. However, the retrainer 123 may be implemented in (e.g., physically provided within or executed by) the memory manager 127. The memory manager 127 may be configured to perform the retraining operation of the nonvolatile memory device 110 when errors are present in the signal transmission timings, based on the errors being present in the signal transmission timings.

Figure 2:
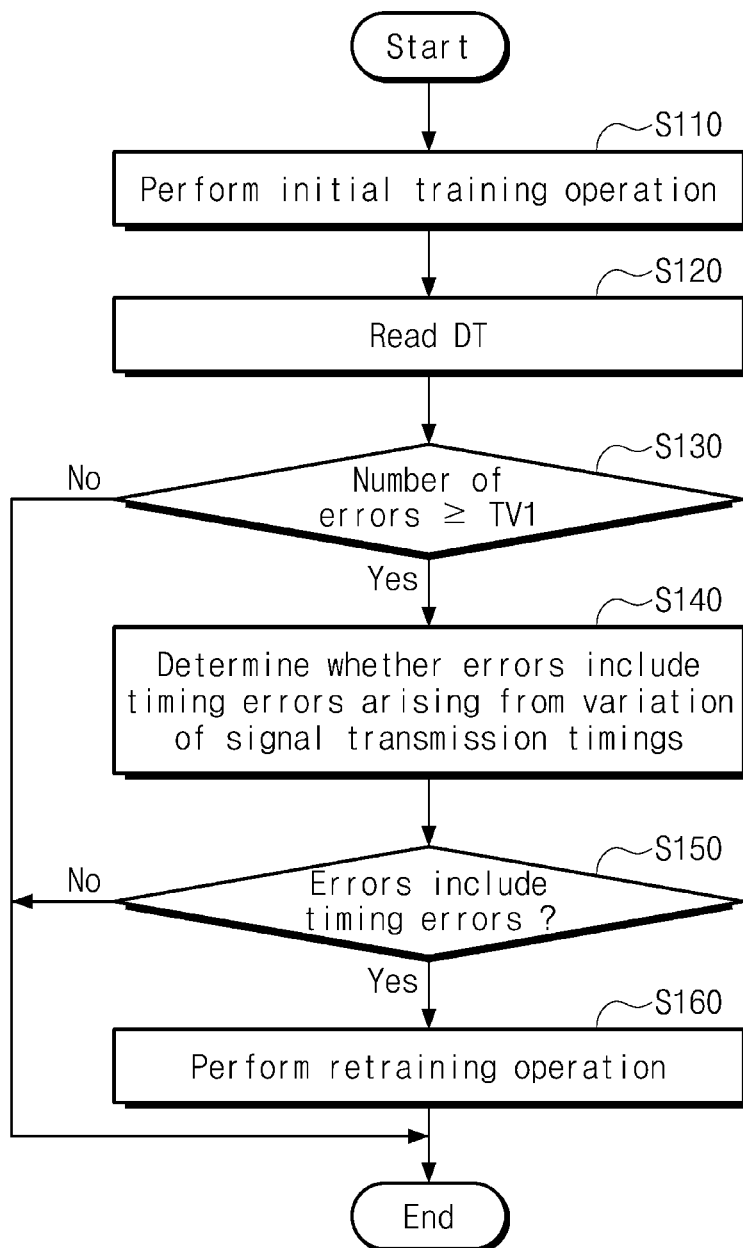
FIG. 2 is a flowchart illustrating an operating method of a storage device according to an embodiment of the present disclosure.

FIG. 2 is a flowchart illustrating an operating method of the storage device 100 according to an embodiment of the present disclosure. Referring to FIGS. 1 and 2, in operation S110, the storage device 100 may perform an initial training operation. For example, the initial training operation may be performed after a power is supplied to the storage device 100 or after the storage device 100 is reset. As the initial training operation is performed, the controller 120 may calibrate delays of the delay locked loops 115, the delay locked loop 117, and the delay locked loops 129 to appropriate delays.

In operation S120, the controller 120 may read the data DT. For example, the controller 120 may read the data DT from the nonvolatile memory device 110 by transmitting the command CMD, the address AD, and the control signals CTRL for the read operation to the nonvolatile memory device 110.

In operation S130, the controller 120 may determine whether the number of errors of the data DT is not smaller than a first threshold value TV1. The controller 120 may detect errors of the data DT by using the error correction block 128 of the memory manager 127. The controller 120 may compare the number of errors with the first threshold value TV1.

When the number of errors is not smaller than the first threshold value TV1, the controller 120 performs operation S140 to determine whether the retraining operation is necessary, based on the number of errors being equal to or larger than the first threshold TV1. When the number of errors is smaller than the first threshold value TV1, the controller 120 may determine that the retraining operation is unnecessary and may terminate a procedure associated with the retraining operation, based on the number of errors being smaller than the first threshold value TV1.

In operation S140, the controller 120 may determine whether the errors include timing errors arising from a variation of the signal transmission timings. For example, the delays of the delay locked loops 115, the delay locked loop 117, and the delay locked loops 129 may vary over time or with a change of a temperature after the delays of the delay locked loops 115, the delay locked loop 117, and the delay locked loops 129 are locked (or fixed). The controller 120 may determine whether a timing error arising from the variation of the delays, that is, the variation of the signal transmission timings exists.

When it is determined in operation S150 that the errors include the timing errors, the controller 120 may perform the retraining operation in operation S160, based on determining that the errors include the timing errors. As explained later, the retraining in operation S160 may be performed based on determining that a number of timing errors is greater than a second threshold TV2 as part of the determination at S150. Thus, the errors compared to the first threshold TV1 may be considered first errors, and the subset of the first errors compared to such a second threshold TV2 may be considered second errors. Afterwards, the procedure associated with the retraining operation may end. When the errors do not include the timing errors, the controller 120 may terminate the procedure associated with the retraining operation, based on determining that the errors do not include the timing errors.

As described above, when the number of errors is not smaller than the first threshold value TV1, the controller 120 may determine whether the retraining operation is necessary. When the retraining operation is necessary, for example, when a timing error exists, the controller 120 may calibrate the delays of the delay locked loops 115, the delay locked loop 117, and the delay locked loops 129 to appropriate delays by performing the retraining operation.

In an embodiment, the first threshold value TV1 may be set to be equal to the maximum number of correctable errors which the error correction block 128 corrects or can correct. For another example, the first threshold value TV1 may be smaller than the maximum number of errors which the error correction block 128 corrects or can correct. That is, in the two examples above the first threshold value may be equal to or smaller than the maximum number of errors which the error correction block 128 corrects (or can correct). In this case, independently of an operation where the controller 120 performs the procedure associated with the retraining operation, the controller 120 may correct an error of the data DT by using the error correction block 128. The controller 120 may provide the error-corrected data to the external host device or may use the error-corrected data internally.

Figure 3:
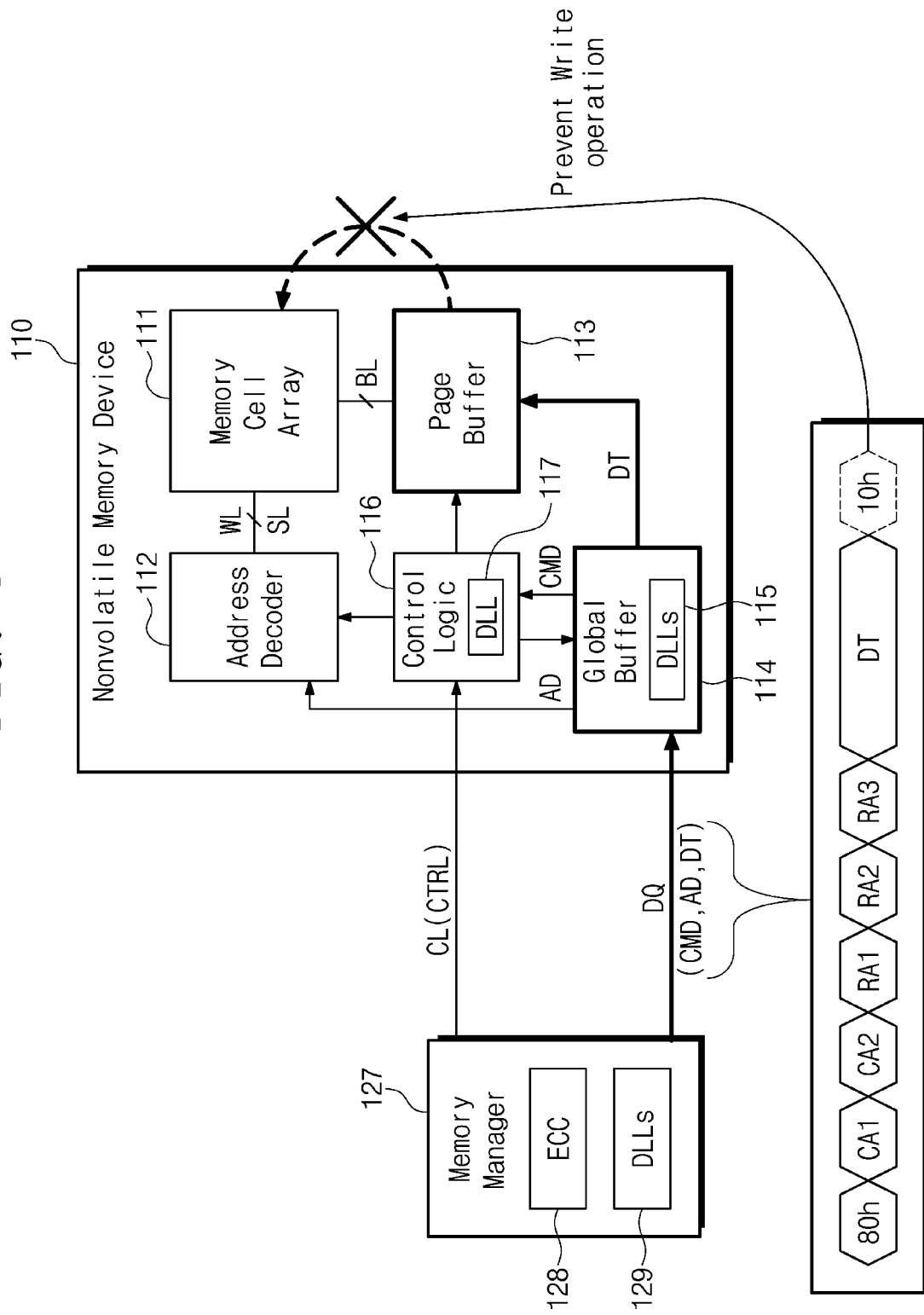
FIGS. 3 and 4 are diagrams illustrating examples of a test operation in which a memory manager determines whether a retraining operation is necessary, according to an embodiment of the present disclosure.
Figure 4:
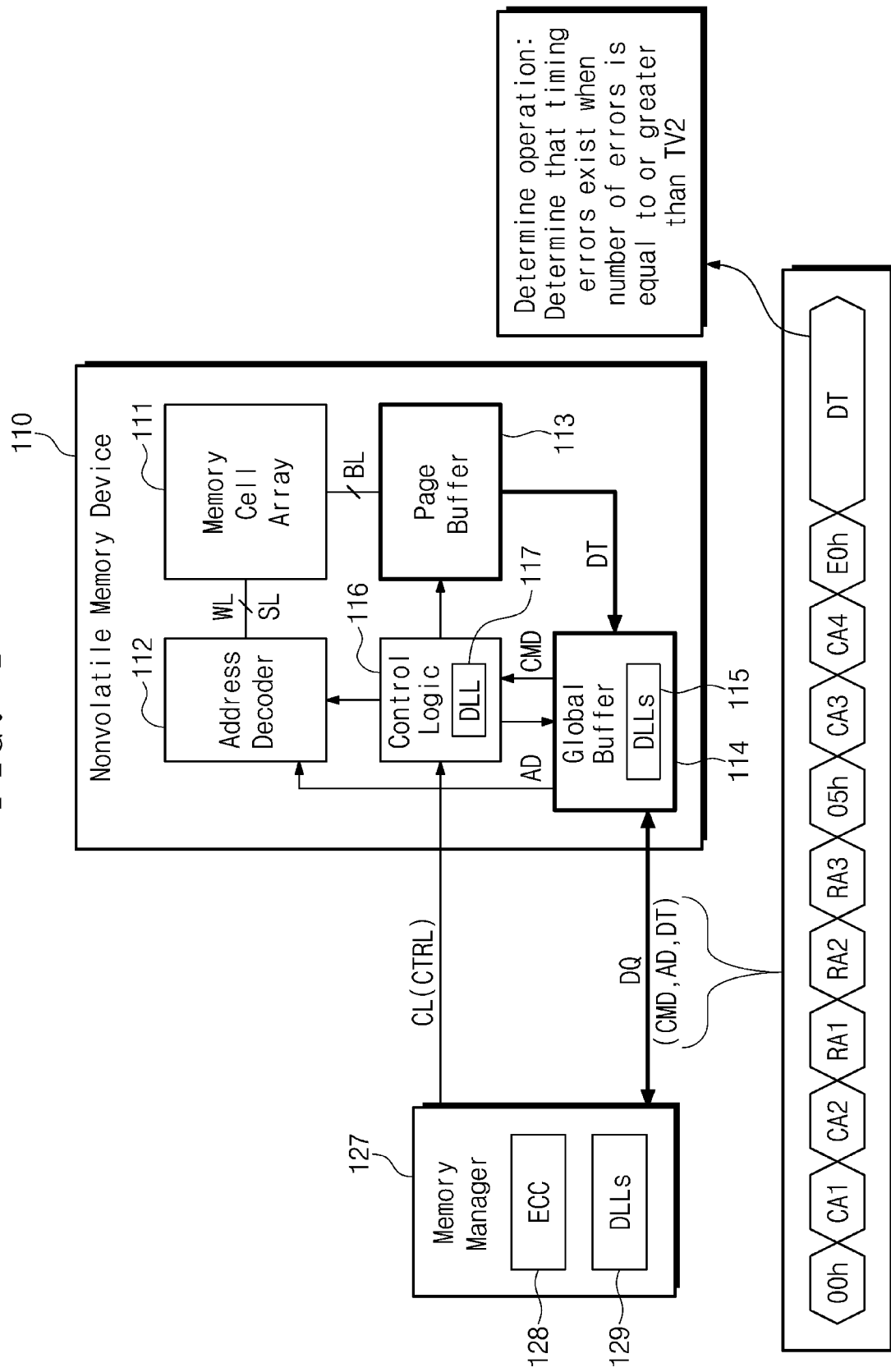

FIGS. 3 and 4 are diagrams illustrating examples of a test operation (corresponding to S130 to S160 in FIG. 2) in which the memory manager 127 according to an embodiment determines whether a retraining operation is necessary. For example, the memory manager 127 may determine whether timing errors exist (S150 in FIG. 2), by transmitting a test pattern (first pattern data) to the nonvolatile memory device 110 (refer to FIG. 3) and receiving the test pattern (second pattern data) from the nonvolatile memory device 110 (refer to FIG. 4). The test pattern may be considered first pattern data when transmitted from the memory manager 127 of the controller 120 to the nonvolatile memory device 110, and second pattern data when transmitted from the nonvolatile memory device 110 to the memory manager 127 of the controller 120.

Referring to FIG. 3, the memory manager 127 may transmit the test pattern (first pattern data) to the nonvolatile memory device 110. The memory manager 127 may transmit the command CMD, the address AD, and the data DT through the input/output lines DQ. For example, after transmitting the command CMD (e.g., a write command) of "80h", the memory manager 127 may transmit, to the nonvolatile memory device 110, the address AD including a first column address CA1, a second column address CA2, a first row address RA1, a second row address RA2, and a third row address RA3.

Following the address AD, the memory manager 127 may transmit specific pattern data (first pattern data) as the data DT to the nonvolatile memory device 110. The data DT are transmitted to the global buffer 114 through the input/output lines DQ. In response to the control signals CTRL, the control logic 116 may control the global buffer 114 such that data DT stored in the global buffer 114 are transmitted to the page buffer 113.

In a conventional write operation, the memory manager 127 may further transmit a command CMD of "10" (e.g., a confirm command). In response to the confirm command, the nonvolatile memory device 110 may perform a write operation by using the data DT stored in the page buffer 113.

The memory manager 127 according to an embodiment may be configured not to transmit the confirm command. Since the confirm command is not transmitted, the write operation using the data DT stored in the page buffer 113 is prevented. That is, the controller 120 controls the nonvolatile memory device 110 such that the first pattern data (data DT) is stored only to the page buffer 113 and is not written to the memory cell array 111, as shown in FIG. 3. The controller 120 may do this by transmitting a write command and the first pattern data (data DT) to the nonvolatile memory device 110, and not transmitting a confirm command as in the conventional write operation. Accordingly, the noise or deterioration of the memory cell array 111, an operation of writing data to the memory cell array 111, and an operation of reading data from the memory cell array 111 are prevented from being applied to the process of transmitting data to the nonvolatile memory device 110 and receiving the data from the nonvolatile memory device 110 for the controller 120 to determine whether timing errors exist.

Referring to FIG. 4, the memory manager 127 may receive the test pattern (second pattern data) from the nonvolatile memory device 110. The memory manager 127 may transmit the command CMD and the address AD through the input/output lines DQ. For example, after transmitting the command CMD (e.g., an output command) of "00h", the memory manager 127 may transmit, to the nonvolatile memory device 110, the address AD including a first column address CA1, a second column address CA2, a first row address RA1, a second row address RA2, and a third row address RA3.

Afterwards, the memory manager 127 may further transmit a command CMD (e.g., an output command) of "05h", an address AD including a third column address CA3 and a fourth column address CA4, and a command CMD (e.g., an output command) of "E0h".

In response to the command CMD and the address AD, the nonvolatile memory device 110 may transmit the data DT (e.g., the specific pattern data as the second pattern data) stored in the page buffer 113 to the memory manager 127 through the global buffer 114 and the input/output lines DQ. The memory manager 127 may receive the data DT (the specific pattern data as the second pattern data) through the input/output lines DQ.

Referring to FIGS. 3 and 4, the data DT are transmitted from the memory manager 127 to the nonvolatile memory device 110 as the first pattern data by using the delay locked loops 129. The data DT are transmitted from the nonvolatile memory device 110 to the memory manager 127 as the second pattern data by using the delay locked loops 115.

The data DT may be transmitted in synchronization with the control signals CTRL transmitted by using the delay locked loops 129 and the delay locked loop 117. The memory manager 127 may detect errors of the data DT (the second pattern data) by using the error correction block 128. Timing errors of the errors of the data DT (the second pattern data) which the memory manager 127 receives may be dominant. The controller 120 (refer to FIG. 1) may determine whether timing errors are present in the error of the received data DT (the second pattern data).

For example, the determination at S150 may be based on a comparison with a second threshold TV2 (not shown in FIG. 2). Accordingly, when the number of errors of the received data DT (the second pattern data) is not smaller than a second threshold value TV2 (not shown in FIG. 2), the controller 120 may determine at S150 that the timing errors exist. Alternatively, in the embodiment of FIG. 2, in operation S120 the controller 120 may also determine that timing errors are included in the errors which cause the test operation shown in FIGS. 3 and 4 (and corresponding to S130 to S160 in FIG. 2), from among errors of data read from the nonvolatile memory device 110 at S120.

Figure 5:
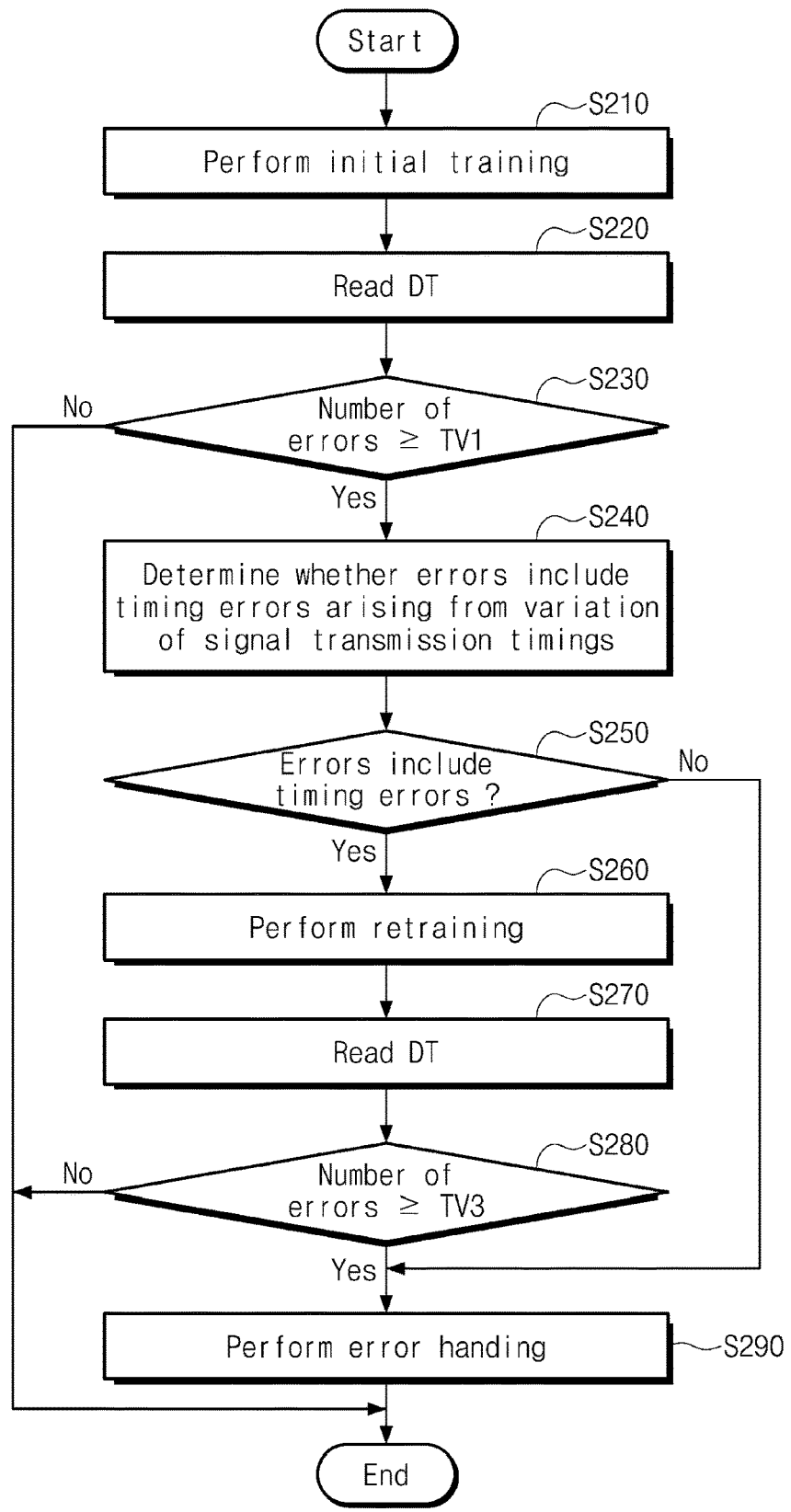
FIG. 5 is a flowchart illustrating an operating method of a storage device according to an application of the teachings of the present disclosure.

FIG. 5 is a flowchart illustrating an operating method of the storage device 100 according to an application of the inventive concept(s) described herein. Referring to FIGS. 1 and 5, operation S210 to operation S260 are performed in the same manner as operation S110 to operation S160 of FIG. 2 except that operation S290 is performed when it is determined in operation S250 that errors do not include timing errors. Thus, additional description associated with operation S210 to operation S260 will be omitted to avoid redundancy. Additionally, in FIG. 5 retraining in operation S260 may be performed based on determining that a number of timing errors is greater than a second threshold TV2 as part of the determination at S250. Thus, the errors compared to the first threshold TV1 may be considered first errors, and the subset of the first errors compared to such a second threshold TV2 may be considered second errors.

After the retraining operation is performed, in operation S270, the memory manager 127 may again read the data DT from the nonvolatile memory device 110. For example, the memory manager 127 may again read the data DT in operation S270 by using the address AD used in operation S220.

The memory manager 127 may detect the number of errors from the data DT thus read again at S270. Since the retraining operation is performed, the detected errors may not include the timing errors. For example, the detected errors may indicate the deterioration or noise of memory cells of the memory cell array 111 or data written to the memory cells.

In operation S280, the controller 120, for example, the processor 122 may compare the number of the detected errors with a third threshold value TV3. The third threshold value TV3 may be equal to or smaller than the maximum number of errors correctable by the error correction block 128. When the number of the detected errors is smaller than the third threshold value TV3, the controller 120 may determine the procedure associated with the errors of the data DT that was read again at S270.

When the number of errors is not smaller than the third threshold value TV3, the controller 120 may handle the errors by using the error handler 124. For example, when the errors are correctable, the error handler 124 may perform or reserve a refresh operation of reading the data DT and storing the read data DT to a storage space of a new address AD.

When the errors are uncorrectable, the error handler 124 may perform a read retry operation in which read operations are repeatedly performed while adjusting read voltages. That is, the error handler 124 of the processor 122 of the controller 120 may be configured to perform a read retry operation in which a read operation is repeated while read voltages are adjusted. The read retry operation may include a soft decision operation of determining final data by using results of repeatedly performing a read operation. When data, the errors of which are corrected, are obtained through the read retry operation, the error handler 124 may perform a refresh operation of storing the obtained data to a storage space of a new address AD.

As described above, after calibrating the timing errors through the retraining operation, the controller 120 may again perform the read operation and may detect errors (e.g., memory errors) arising from the memory cell array 111. Depending on the number of memory errors, the controller 120 may perform error processing/handling for correcting the memory errors. That is, the controller 120 may include the retrainer 123 for calibrating the timing errors and the error handler 124 for calibrating the memory errors.

In an embodiment, independently of the threshold value TV1 or TV2, when errors of the data DT are corrected, the controller 120 may output the error-corrected data to the external host device or may use the error-corrected data internally. In an embodiment, operation S270 in which the data DT are again read may be performed when errors of the data DT read in operation S220 are uncorrectable. That is, the first threshold value TV1 may be equal to the maximum number of errors which the error correction block 128 corrects or can correct.

Figure 6:
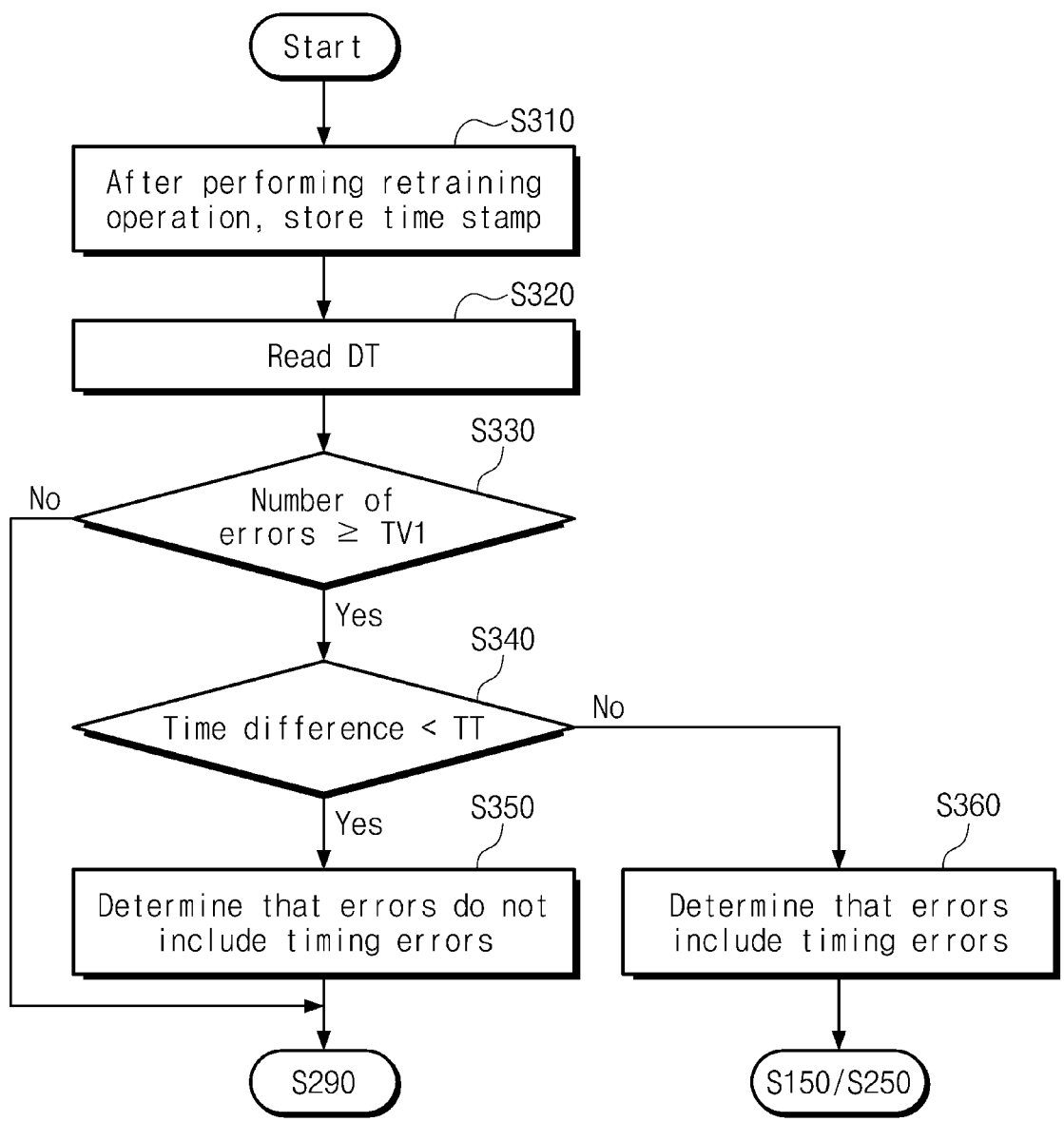
FIG. 6 is a flowchart illustrating an example in which information of a retraining operation is applied to a next retraining operation according to an embodiment of the present disclosure.

FIG. 6 is a flowchart illustrating an example in which information of a retraining operation is applied to a next retraining operation. Referring to FIGS. 1 and 6, in operation S310, the controller 120 may store a time stamp after performing the retraining operation. The time stamp may include information about a time when the retraining operation is performed.

In operation S320, the controller 120 may read the data DT from the nonvolatile memory device 110 based on a request of the external host device or an internal schedule. In operation S330, the controller 120 may determine whether the number of errors of the data DT is not smaller than the first threshold value TV1. Operation S320 and operation S330 may be equal to operation S120 and operation S130 described with reference to FIG. 2.

When the number of errors is not smaller than the first threshold value TV1, in operation S340, the controller 120 may determine whether a time difference is smaller than a threshold time TT. For example, the controller 120 may read a time stamp. The controller 120 may compare time information of the time stamp with current time information.

When a difference between a current time and a previous time when the retraining operation is performed is smaller than the threshold time TT, operation S350 is performed. When a long time does not pass after the retraining operation is performed, the signal transmission timings of the delay locked loops 115, the delay locked loop 117, and the delay locked loops 129 may be maintained normally. Accordingly, in operation S350, the controller 120 may determine that the errors do not include the timing errors. Afterwards, as described with reference to operation S290 of FIG. 5, the controller 120 may perform error processing/handling.

When the difference between the current time and the previous time when the retraining operation is performed is not smaller than the threshold time TT, operation S360 is performed. When a long time does not pass after the retraining operation is performed, the signal transmission timings of the delay locked loops 115, the delay locked loop 117, and the delay locked loops 129 may be unlocked. Accordingly, in operation S360, the controller 120 may determine that the errors include the timing errors. Afterwards, the controller 120 may perform operation S150 of FIG. 2 or operation S250 of FIG. 5.

As described above, the controller 120 may determine that the errors do not include the timing errors, as a time passes after the retraining operation is performed. In FIG. 6, the controller 120 is described as performing the determination according to a time. However, the method of FIG. 6 may be changed or modified as performing the determination according to a temperature.

For example, in operation S310, the controller 120 may store a temperature stamp indicating temperature information when the retraining operation is performed. In operation S340, the controller 120 may compare a difference between a temperature of the temperature stamp and a current temperature with a threshold temperature. When the different is smaller than the threshold temperature, the controller 120 may determine that the errors do not include the timing errors.

Figure 7:
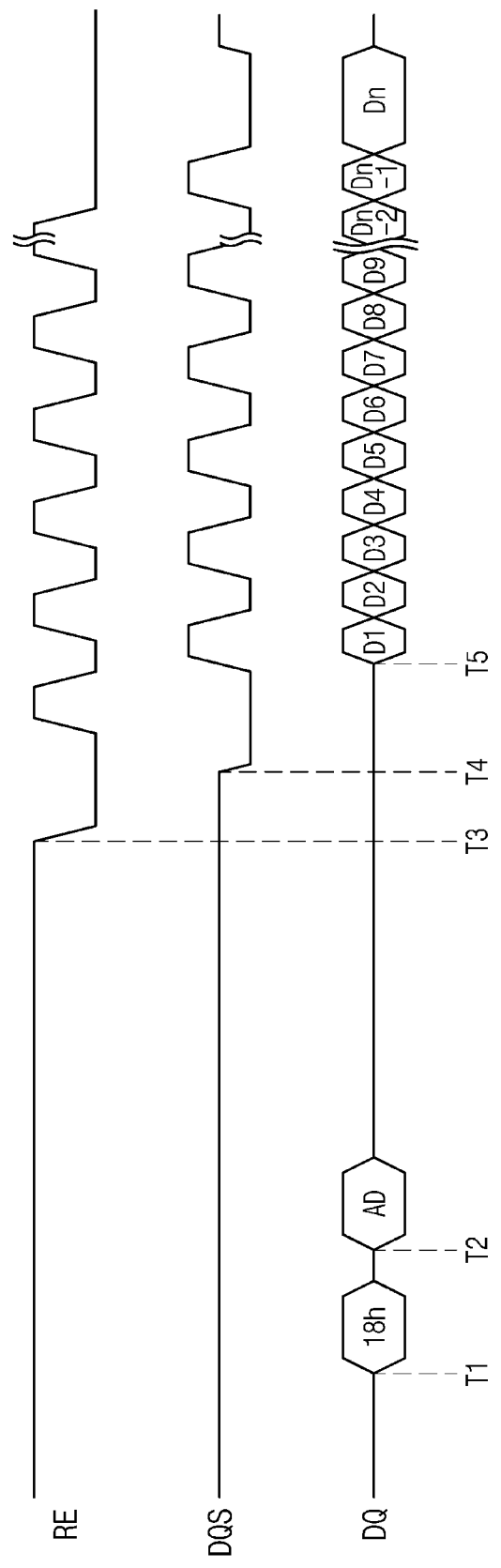
FIG. 7 is a diagram illustrating a first example of a retraining operation according to an embodiment of the present disclosure.

FIG. 7 is a diagram illustrating a first example of a retraining operation. Referring to FIGS. 1 and 7, the retraining operation may include calibrating transmission timings of a read enable signal RE of the control signals CTRL. At a first time T1, the memory manager 127 may transmit a training command of "18h" as the command CMD to the nonvolatile memory device 110 through the input/output lines DQ.

At a second time T2, the memory manager 127 may transmit the address AD to the nonvolatile memory device 110 through the input/output lines DQ. The address AD may include a logical unit number (LUN).

At a third time T3, the memory manager 127 may toggle the read enable signal RE of the control signals CTRL. For example, the read enable signal RE may include complementary first signal(s) and second signal(s).

At a fourth time T4, the nonvolatile memory device 110 may generate a data strobe signal DQS from the read enable signal RE by using the delay locked loop 117. For example, the control logic 116 may delay the read enable signal RE to generate the data strobe signal DQS.

The data strobe signal DQS may include complementary first signal(s) and second signals. The nonvolatile memory device 110 may transmit the data strobe signal DQS as one of the control signals CTRL to the memory manager 127. At a fifth time T5, the global buffer 114 of the nonvolatile memory device 110 may transmit, to the memory manager 127, pattern data D1 to Dn through the input/output lines DQ in synchronization with the data strobe signal DQS.

Figure 8:
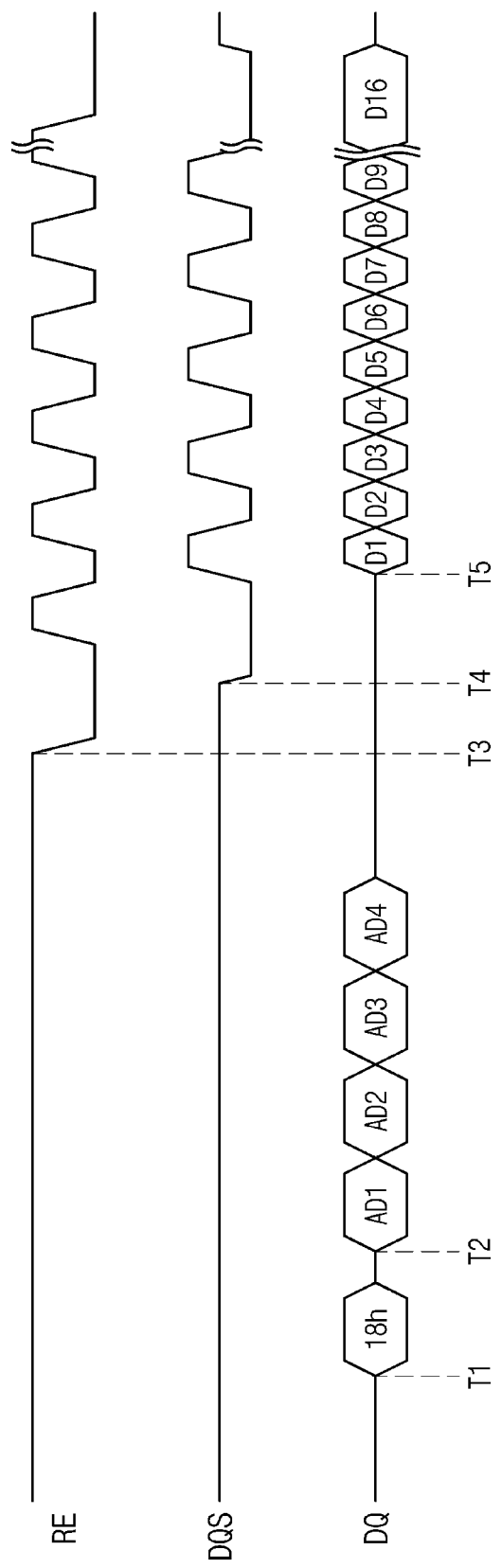
FIG. 8 is a diagram illustrating a second example of a retraining operation according to an embodiment of the present disclosure.

The pattern data D1 to Dn may correspond to the size of one page of the nonvolatile memory device 110. The page may include multiple memory cells, and may be a basic unit of a read operation or a write operation. The pattern data D1 to Dn may have a given pattern. The memory manager 127 may adjust a delay of a delay locked loop corresponding to the read enable signal RE among the delay locked loops 129, and may repeat the procedure illustrated in FIG. 7. The memory manager 127 may calibrate the delay of the delay locked loop. FIG. 8 is a diagram illustrating a second example of a retraining operation. Referring to FIGS. 1 and 8, the retraining operation may include a read training operation of adjusting timings at which the nonvolatile memory device 110 transmits the data DT through the input/output lines DQ.

At a first time T1, the memory manager 127 may transmit a read training command of "62h" as the command CMD to the nonvolatile memory device 110 through the input/output lines DQ. At a second time T2, the memory manager 127 may sequentially transmit a first address AD1, a second address AD2, a third address AD3 and a fourth address AD4 to the nonvolatile memory device 110 through the input/output lines DQ.

The first address AD1 may include a logical unit number (LUN). The second address AD2 may include byte inversion setting. Each of the third address AD3 and the fourth address AD4 may include a specific pattern of eight bits.

At a third time T3, the memory manager 127 may toggle the read enable signal RE. At a fourth time T4, the control logic 116 may delay the read enable signal RE to generate the data strobe signal DQS. At a fifth time T5, the global buffer 114 may output pattern data D1 to Dn through the input/output lines DQ in synchronization with the data strobe signal DQS. The pattern data D1 to Dn may have specific bits.

The memory manager 127 may adjust delays of the delay locked loops 115, and may repeat the procedure illustrated in FIG. 8. The memory manager 127 may calibrate delays of the delay locked loops 115. That is, in FIG. 8, the memory manager 127 of the controller 120 controls the delay locked loops 115 of the global buffer 114 of the nonvolatile memory 110 such that the nonvolatile memory device outputs the first pattern data (pattern data D1 to Dn) as the second pattern data depending on read signal transmission timings of the signal transmission timings. Additionally, in FIG. 8, As described above, a retraining operation may include calibrating, at the memory manager 127 of the controller 120, data transmission timings of the nonvolatile memory device 110 while the nonvolatile memory device 110 transmits specific pattern data (pattern data D1 to Dn) to the controller 120.

Figure 9:
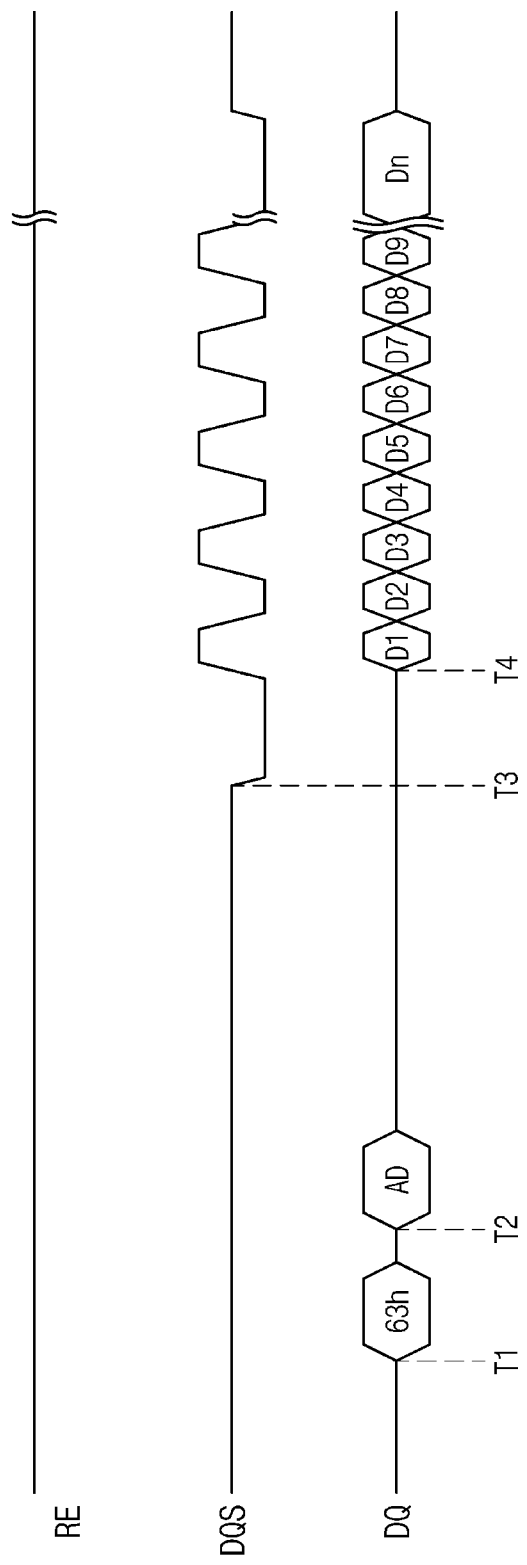
FIGS. 9 and 10 are diagrams illustrating a third example of a retraining operation according to an embodiment of the present disclosure.
Figure 10:
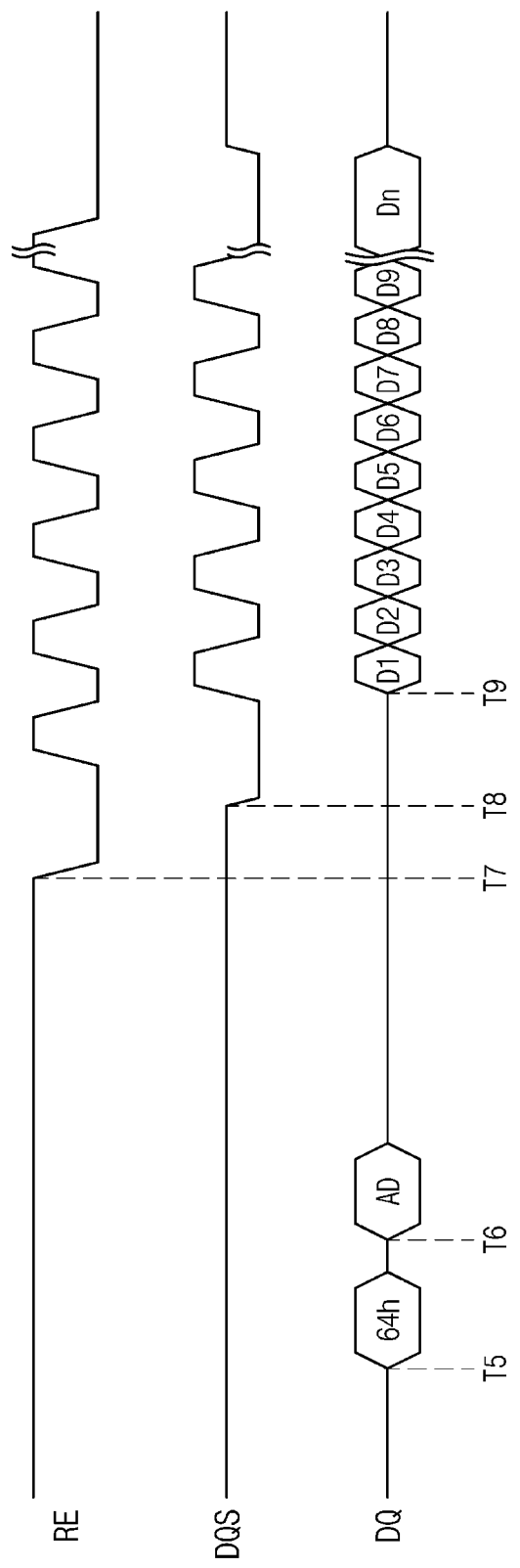

FIGS. 9 and 10 are diagrams illustrating a third example of a retraining operation. The retraining operation may include a write training operation of adjusting timings at which the memory manager 127 transmits the data DT through the input/output lines DQ.

Referring to FIGS. 1 and 9, at a first time T1, the memory manager 127 may transmit a first write training command of "63h" as the command CMD through the input/output lines DQ. At a second time T2, the memory manager 127 may transmit the address AD to the nonvolatile memory device 110 through the input/output lines DQ. The address AD may include a logical unit number (LUN).

At a third time T3, the memory manager 127 may toggle the data strobe signal DQS of the control signals CTRL. The data strobe signal DQS may include complementary first signal(s) and second signal(s).

At a fourth time T4, the memory manager 127 may transmit, to the nonvolatile memory device 110, pattern data D1 to Dn through the input/output lines DQ in synchronization with the data strobe signal DQS. The pattern data D1 to Dn may have specific bits.

Referring to FIGS. 1 and 10, at a fifth time T5, the memory manager 127 may transmit, to the nonvolatile memory device 110, a second write training command of "64h" as the command CMD through the input/output lines DQ. At a sixth time T6, the memory manager 127 may transmit the address AD to the nonvolatile memory device 110 through the input/output lines DQ. The address AD may include a logical unit number (LUN).

At a seventh time T7, the memory manager 127 may toggle the read enable signal RE. At an eighth time T8, the control logic 116 may delay the read enable signal RE to generate the data strobe signal DQS.

At a ninth time T9, the global buffer 114 may transmit, to the memory manager 127, the pattern data D1 to Dn through the input/output lines DQ in synchronization with the data strobe signal DQS.

The memory manager 127 may adjust delays of the delay locked loops 129, and may repeat the procedure illustrated in FIGS. 9 and 10. The memory manager 127 may calibrate delays of the delay locked loops 129. That is, in the embodiment of FIGS. 9 and 10, the memory manager 127 of the controller 120 controls the delay locked loops 129 such that the memory manager 127 outputs the first pattern data (pattern data D1 to Dn) depending on write signal transmission timings of the signal transmission timings.

Additionally, in the embodiment of FIGS. 9 and 10, the pattern data D1 to Dn may be considered calibration data. The retraining operation in this embodiment includes calibrating, at the memory manager 127 of the controller 120, data transmission timings while the controller 120 transmits calibration data to the nonvolatile memory device 110 and receives the calibration data from the nonvolatile memory device 110.

Figure 11:
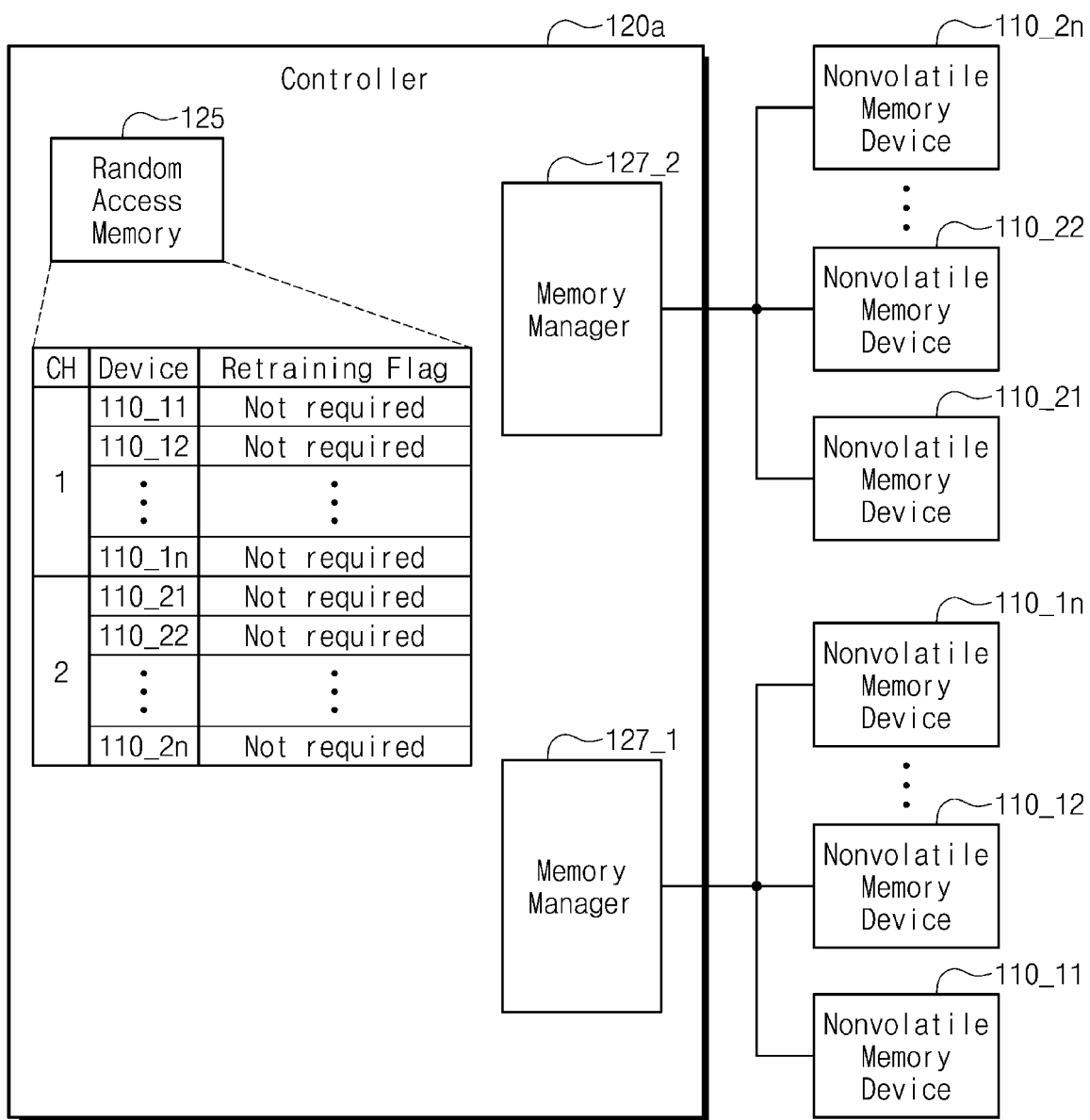
FIG. 11 is a block diagram illustrating another storage device according to an embodiment of the present disclosure.

FIG. 11 is a block diagram illustrating a storage device 100a according to an application of the inventive concept(s) described herein. Referring to FIG. 11, the storage device 100a includes first nonvolatile memory devices 110_11 to 110_1n, second nonvolatile memory devices 110_21 to 110_2n, and a controller 120a.

Each of the first nonvolatile memory devices 110_11 to 110_1n and the second nonvolatile memory devices 110_21 to 110_2n may include the memory cell array 111, the address decoder 112, the page buffer 113, the global buffer 114, and the control logic 116, as described with reference to FIG. 1.

The controller 120a may include a first memory manager 127_1 to control the first nonvolatile memory devices 110_11 to 110_1n, a second memory manager 127_2 to control the second nonvolatile memory devices 110_21 to 110_2n, and the random access memory 125.

In an embodiment, as described with reference to FIG. 1, the controller 120a may further include the bus 121, the processor 122, and the host interface block 126. Also, each of the first memory manager 127_1 and the second memory manager 127_2 may include the error correction block 128 and the delay locked loops 129.

The first memory manager 127_1 may control the first nonvolatile memory devices 110_11 to 110_1n through a first channel CH1. The first memory manager 127_1 may communicate with the first nonvolatile memory devices 110_11 to 110_1n through shared input/output lines DQ. The first memory manager 127_1 may communicate with the first nonvolatile memory devices 110_11 to 110_1n through common first shared control lines and second independent control lines.

For example, the first memory manager 127_1 may transmit, to the first nonvolatile memory devices 110_11 to 110_1n, control signals, which are used in common in the first nonvolatile memory devices 110_11 to 110_1n through the first shared control lines. Control signals include, for example, a read enable signal RE, a data strobe signal DQS, a write enable signal WE, a command latch enable signal CLE, and an address latch enable signal ALE.

The first memory manager 127_1 may individually convey, to the first nonvolatile memory devices 110_11 to 110_1n, chip enable signals CE indicating a nonvolatile memory device to be selected among the first nonvolatile memory devices 110_11 to 110_1n and ready/busy signals R/nB indicating states of the first nonvolatile memory devices 110_11 to 110_1n.

As described with reference to FIGS. 1 and 10, the first memory manager 127_1 may determine whether each of the first nonvolatile memory devices 110_11 to 110_1n has timing errors and may perform a retraining operation. The first memory manager 127_1 may further perform error processing/handling on each of the first nonvolatile memory devices 110_11 to 110_1n.

The second memory manager 127_2 may control the second nonvolatile memory devices 110_21 to 110_2n through a second channel CH2. Operations of the second memory manager 127_2 and the second nonvolatile memory devices 110_21 to 110_2n may be equal to the operations of the first memory manager 127_1 and the first nonvolatile memory devices 110_11 to 110_1n.

Retraining flags associated with first nonvolatile memory devices 110_11 to 110_1n and the second nonvolatile memory devices 110_21 to 110_2n may be stored to the random access memory 125. The retraining flags may indicate whether a retraining operation associated with the first nonvolatile memory devices 110_11 to 110_1n and the second nonvolatile memory devices 110_21 to 110_2n is required or not.

For example, when a retraining flag of a specific nonvolatile memory device is set as the retraining operation is required, the controller 120a may perform the retraining operation on the specific nonvolatile memory device at an idle time or when an access to the specific nonvolatile memory device is required. The idle time may indicate a time when a task which is transmitted from the external host device and which the controller 120a should process does not exist.

According to an embodiment of the present disclosure, when the specific nonvolatile memory device includes timing errors, the controller 120a may reserve the retraining operation such that the retraining operation is not immediately performed, that is, such that the retraining operation is next performed. Accordingly, the storage device 100a which may adjust a task schedule flexibly and has improved performance is provided.

Figure 12:
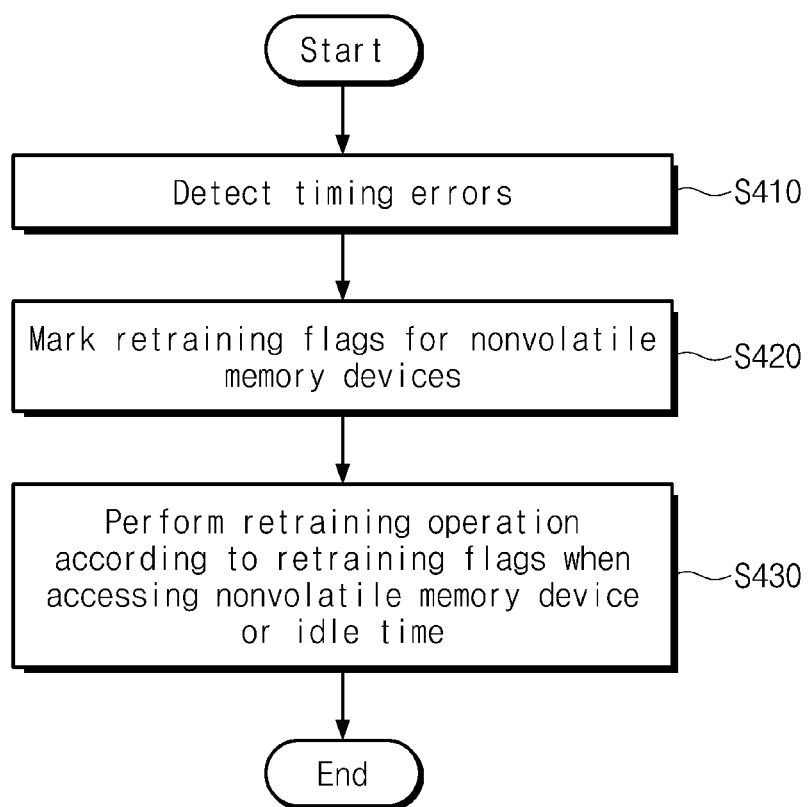
FIG. 12 is a flowchart illustrating an operating method of a storage device according to an application of the teachings of the present disclosure.

FIG. 12 is a flowchart illustrating an operating method of the storage device 100a according to an application of the inventive concept(s) described herein. Referring to FIG. 12, in operation S410, the controller 120a may detect timing errors from a specific nonvolatile memory device among the first nonvolatile memory devices 110_11 to 110_1n and the second nonvolatile memory devices 110_21 to 110_2n.

In operation S420, the controller 120a may mark retraining flags for nonvolatile memory devices corresponding to the specific nonvolatile memory device having the timing errors. For example, the controller 120a may mark a retraining flag of nonvolatile memory devices belonging to the same channel as the specific nonvolatile memory device so as to indicate that the retraining operation is required.

In operation S430, upon accessing a nonvolatile memory device or at an idle time, the controller 120a may perform the retraining operation depending on the retraining flag. For example, when accessing a nonvolatile memory device needing the retraining operation, the controller 120a may first perform the retraining operation before the access is made.

Figure 13:
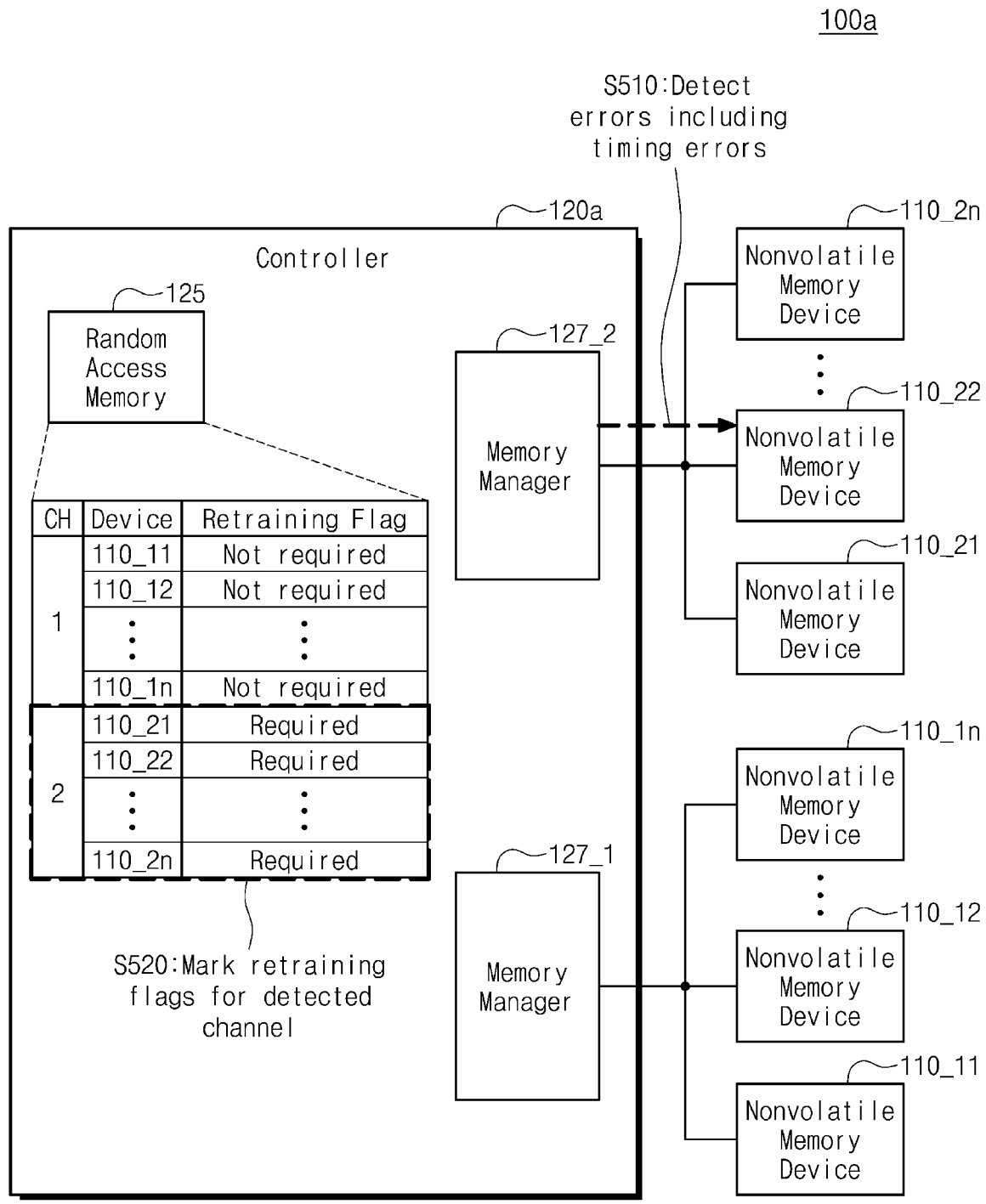
FIG. 13 is a diagram illustrating an example in which a storage device operates depending on the operating method of FIG. 12.

FIG. 13 is a diagram illustrating an example in which the storage device 100a operates depending on the operating method of FIG. 12. Referring to FIG. 13, in operation S510, the second memory manager 127_2 may detect errors including timing errors from the nonvolatile memory device 110_22. As the timing errors are detected, in operation S520, the controller 120a may set retraining flags of the second nonvolatile memory devices 110_21 to 110_2n included in the second channel CH2 so as to indicate that the retraining operation is required.

Afterwards, the controller 120a may perform the retraining operation at an idle time or upon accessing any nonvolatile memory device of the second nonvolatile memory devices 110_21 to 110_2n.

When timing errors are detected from one nonvolatile memory device belonging to a specific channel, the retraining operations may be performed on all nonvolatile memory devices belonging to the specific channel, based on detecting the timing errors from the one nonvolatile memory device belonging to the specific channel. The storage device 100a according to an embodiment is configured to distribute and perform the retraining operations on the nonvolatile memory devices. Accordingly, a time delay occurring when the retraining operations are simultaneously performed is prevented.

In the above-described embodiments, components according to embodiments of the present disclosure are referred to using terms such as "block", "processor", "retrainer", "error handler", "memory manager" and "control logic". These components may be implemented with various hardware devices, such as an integrated circuit, an application specific IC (ASCI), a field programmable gate array (FPGA), and a complex programmable logic device (CPLD), software such as firmware and applications driven in hardware devices, or a combination of a hardware device and software. Also, these components may include circuits or intellectual property (IP) implemented with semiconductor devices. However, unless otherwise specified, none of these components is implemented without one or more hardware devices, even if the component refers to software executed by such hardware devices.

According to embodiments of the present disclosure, a controller performs retraining on a nonvolatile memory device when errors including timing errors occur, based on determining that the errors including timing errors have occurred. Accordingly, storage devices with controllers and nonvolatile memory devices may calibrate timing errors caused due to increased communication speeds between such controllers and nonvolatile memory devices.

While the inventive concept(s) described herein have been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A storage device, comprising:
   a nonvolatile memory device; and
   a controller configured to read first data from the nonvolatile memory device at signal transmission timings trained according to a training operation,
   wherein, when a number of first errors of the first data is not smaller than a first threshold value, the controller is further configured to determine whether the first errors include timing errors arising from a variation of the signal transmission timings between the nonvolatile memory device and the controller based on the number of first errors of the first data not being smaller than the first threshold value, and to perform a retraining operation on the signal transmission timings when the first errors include the timing errors based on the first errors including the timing errors, and
   wherein the first threshold value is greater than zero.

2. The storage device of claim 1, wherein the controller includes an error correction block configured to correct the first errors, and
   wherein the first threshold value is equal to or smaller than a maximum number of errors which the error correction block corrects.

3. The storage device of claim 1, wherein the controller is configured to:
   transmit first pattern data to the nonvolatile memory device;
   receive second pattern data from the nonvolatile memory device responsive to the first pattern data transmitted to the nonvolatile memory device; and
   determine whether the first errors of the first data include the timing errors, depending on second errors of the second pattern data.

4. The storage device of claim 3, wherein the nonvolatile memory device includes:
   a memory cell array including memory cells; and
   a buffer connected to the memory cell array, and
   wherein the controller controls the nonvolatile memory device such that the first pattern data are not written to the memory cell array and are stored only to the buffer.

5. The storage device of claim 4, wherein the controller controls the nonvolatile memory device such that the first pattern data are stored only to the buffer, by transmitting a write command and the first pattern data to the nonvolatile memory device and not transmitting a confirm command.

6. The storage device of claim 3, wherein the controller controls the nonvolatile memory device such that the nonvolatile memory device outputs the first pattern data as the second pattern data depending on read signal transmission timings of the signal transmission timings.

7. The storage device of claim 3, wherein, when a number of the second errors is not smaller than a second threshold value, the controller determines that the first errors include the timing errors based on the number of the second errors not being smaller than the second threshold value.

8. The storage device of claim 1, wherein, when the first errors are uncorrectable, the controller is further configured to again read the first data as second data from the nonvolatile memory device after performing the retraining operation based on the first errors being uncorrectable.

9. The storage device of claim 8, wherein, when a number of second errors of the second data is not smaller than a second threshold value, the controller is further configured to perform a refresh operation on the second data based on the number of second errors of the second data not being smaller than the second threshold value.

10. The storage device of claim 8, wherein, when second errors of the second data are uncorrectable, the controller is further configured to perform a read retry operation in which a read operation is repeated while read voltages are adjusted based on the second errors of the second data being uncorrectable.

11. The storage device of claim 1, wherein the controller is further configured to store first time information after performing the retraining operation, to read second data from the nonvolatile memory device, and to store second time information when the second data are read, and
    wherein, when a number of second errors of the second data is not smaller than the first threshold value, the controller is further configured to compare the first time information and second time information based on the number of second errors of the second data not being smaller than the first threshold value, and to determine that the second errors do not include the timing errors when a difference between the first time information and the second time information is smaller than a threshold time based on the difference between the first time information and the second time information being smaller than the threshold time.

12. The storage device of claim 1, wherein the controller is further configured to store first temperature information after performing the retraining operation, to read second data from the nonvolatile memory device, and to store second temperature information when the second data are read, and wherein, when a number of second errors of the second data is not smaller than the first threshold value, the controller is further configured to compare the first temperature information and second temperature information based on the number of second errors of the second data not being smaller than the first threshold value, and to determine that the second errors do not include the timing errors when a difference between the first temperature information and the second temperature information is smaller than a threshold temperature based on the difference between the first temperature information and the second temperature information being smaller than the threshold temperature.

13. The storage device of claim 1, wherein the retraining operation includes calibrating transmission timings of a data strobe signal conveyed between the controller and the nonvolatile memory device.

14. The storage device of claim 1, wherein the retraining operation includes calibrating, at the controller, data transmission timings of the nonvolatile memory device while the nonvolatile memory device transmits specific pattern data to the controller.

15. The storage device of claim 1, wherein the retraining operation includes calibrating, at the controller, data transmission timings while the controller transmits calibration data to the nonvolatile memory device and receives the calibration data from the nonvolatile memory device.

16. A storage device, comprising:
first nonvolatile memory devices;
second nonvolatile memory devices; and
a controller configured to communicate with the first nonvolatile memory devices through a first channel at signal transmission timings trained according to a training operation and to communicate with the second nonvolatile memory devices through a second channel at signal transmission timings trained according to the training operation,
wherein, when a number of errors of data read from a specific nonvolatile memory device of the first nonvolatile memory devices is not smaller than a threshold value, the controller is further configured to determine whether the errors include timing errors arising from a variation of signal transmission timings between the specific nonvolatile memory device and the controller based on the number of errors of data read from the specific nonvolatile memory device of the first nonvolatile memory devices not being smaller than the threshold value, and to determine the first nonvolatile memory devices as targets of a retraining operation when the errors include the timing errors based on the errors including the timing errors, and
wherein the threshold value is greater than zero.

17. The storage device of claim 16, wherein the controller performs the retraining operation on the specific nonvolatile memory device at an idle time or when an access to the specific nonvolatile memory device is required.

18. An operating method of a storage device which includes a nonvolatile memory device and a controller, the method comprising:
reading, at the controller, data from the nonvolatile memory device at signal transmission timings trained according to a training operation;
transmitting, at the controller, first test data to the nonvolatile memory device and receiving, at the controller, second test data from the nonvolatile memory device responsive to the first test data transmitted to the nonvolatile memory device, when a number of first errors of the data read at the controller is not smaller than a first threshold value based on the number of first errors of the data read at the controller not being smaller than the first threshold value; and
performing, at the controller, a retraining operation on the nonvolatile memory device for the signal transmission timings when a number of second errors of the second test data is not smaller than a second threshold value based on the number of second errors of the second test data not being smaller than the second threshold value,
wherein the first threshold value is greater than zero.

19. The method of claim 18, further comprising:
receiving, at the nonvolatile memory device, the first test data from the controller and transmitting, at the nonvolatile memory device, the first test data as the second test data to the controller.

20. The method of claim 18, further comprising:
reading, at the controller, the data again from the nonvolatile memory device after the retraining operation is performed, when the first errors are uncorrectable based on the first errors being uncorrectable.

* * * * *